(12) United States Patent
Begun et al.

(10) Patent No.: US 7,593,949 B2
(45) Date of Patent: Sep. 22, 2009

(54) COMPRESSION OF STRUCTURED DOCUMENTS

(75) Inventors: Andrew P Begun, Redmond, WA (US); Thomas R Lawrence, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 299 days.

(21) Appl. No.: 11/328,300

(22) Filed: Jan. 9, 2006

(65) Prior Publication Data
US 2007/0162479 A1      Jul. 12, 2007

(51) Int. Cl.
*G06F 17/00*     (2006.01)
*G06F 7/00*      (2006.01)
(52) U.S. Cl. ........................ 707/100; 707/101
(58) Field of Classification Search .................. None
See application file for complete search history.

(56) References Cited

U.S. PATENT DOCUMENTS 5,991,713 A   11/1999  Unger et al.
6,631,379 B2  10/2003  Cox
6,635,088 B1  10/2003  Hind et al.

(Continued)

FOREIGN PATENT DOCUMENTS

WO    WO-2005067153    7/2005

OTHER PUBLICATIONS

High Performance and Appliance Approaches for XML Report: XML and Web Services at Wire-Speed [http:www.zapthink.com/report.html?id=ZTR-DI102], Dec. 29, 2005.

(Continued)

*Primary Examiner*—Baoquoc N To (57) ABSTRACT

Various embodiments are disclosed relating to a compression of documents. According to an example embodiment, a document may be compressed by replacing one or more language constructs in the document with a language-based replacement code. In addition, the document may be compressed by replacing one or more text strings in the document with a schema-based replacement code.

12 Claims, 4 Drawing Sheets

U.S. PATENT DOCUMENTS

| | | | |
|---|---|---|---|
| 6,643,652 | B2 | 11/2003 | Helgeson et al. |
| 6,665,731 | B1 | 12/2003 | Kumar et al. |
| 6,711,740 | B1 | 3/2004 | Moon et al. |
| 6,725,424 | B1 | 4/2004 | Schwerdtfeger et al. |
| 6,732,109 | B2 | 5/2004 | Lindberg et al. |
| 6,782,380 | B1 | 8/2004 | Thede |
| 6,804,677 | B2 | 10/2004 | Shadmon et al. |
| 6,845,380 | B2 | 1/2005 | Su et al. |
| 6,850,948 | B1 | 2/2005 | Krasinski |
| 6,871,320 | B1 * | 3/2005 | Morihara et al. ............ 715/513 |
| 6,883,137 | B1 | 4/2005 | Girardot et al. |
| 6,961,760 | B2 | 11/2005 | Li et al. |
| 7,043,686 | B1 | 5/2006 | Maruyama et al. |
| 7,054,851 | B2 | 5/2006 | Haley |
| 7,089,567 | B2 | 8/2006 | Girardot et al. |
| 7,119,577 | B2 | 10/2006 | Sharangpani |
| 7,120,869 | B2 | 10/2006 | Birder |
| 7,131,077 | B1 | 10/2006 | James-Roxby et al. |
| 7,143,397 | B2 | 11/2006 | Imaura |
| 7,152,058 | B2 | 12/2006 | Shotton et al. |
| 7,152,205 | B2 | 12/2006 | Day et al. |
| 7,174,327 | B2 | 2/2007 | Chau et al. |
| 7,191,196 | B2 | 3/2007 | Perks et al. |
| 7,257,575 | B1 | 8/2007 | Johnston et al. |
| 7,281,205 | B2 | 10/2007 | Brook |
| 2001/0054172 | A1 | 12/2001 | Tuatini |
| 2002/0032706 | A1 | 3/2002 | Perla et al. |
| 2002/0065822 | A1 * | 5/2002 | Itani ........................... 707/7 |
| 2002/0073120 | A1 | 6/2002 | Bierbrauer et al. |
| 2002/0087596 | A1 | 7/2002 | Lewontin |
| 2002/0107866 | A1 | 8/2002 | Cousins et al. |
| 2002/0107887 | A1 | 8/2002 | Cousins |
| 2002/0138518 | A1 | 9/2002 | Kobayashi et al. |
| 2002/0156803 | A1 | 10/2002 | Maslov et al. |
| 2002/0157023 | A1 | 10/2002 | Callahan et al. |
| 2002/0161801 | A1 | 10/2002 | Hind et al. |
| 2002/0198743 | A1 | 12/2002 | Ariathurai et al. |
| 2003/0018466 | A1 | 1/2003 | Imaura |
| 2003/0158854 | A1 | 8/2003 | Yoshida et al. |
| 2003/0167445 | A1 | 9/2003 | Su et al. |
| 2004/0003343 | A1 | 1/2004 | Liao et al. |
| 2004/0215595 | A1 | 10/2004 | Bax |
| 2005/0182778 | A1 | 8/2005 | Heuer et al. |
| 2005/0228791 | A1 | 10/2005 | Thusoo et al. |
| 2005/0228792 | A1 | 10/2005 | Chandrasekaran et al. |
| 2005/0268341 | A1 | 12/2005 | Ross |
| 2006/0117307 | A1 | 6/2006 | Averbuch et al. |
| 2006/0150168 | A1 | 7/2006 | Mitchell et al. |
| 2006/0218161 | A1 * | 9/2006 | Zhang et al. ................ 707/100 |
| 2006/0253465 | A1 | 11/2006 | Willis et al. |

OTHER PUBLICATIONS

Will Binary XML Solve XML Performance Woes? Zapflash. [http://www.zapthink.com/report.html?id=ZAPFLASH-11162004].

XML Sizing and Compression Study For Military Wireless Data [http://www.idealliance.org/papers/xml02/dx_xml02/papers/06-02-04/06-02-04.html].

Manolis, et al., "A Web-Based System for Handling Multidimensional Information through MXML", ADBIS 2001 (LNCS 2151), Vilnius, Lithuania, Sep. 25-28, 2001, pp. 352-365.

Marat, et al., "Designing an XML-Based Exchange Format for Harmonia", Proc. of 7th Working Cont. on Reverse Engineering, Nov. 23-25, 2000, pp. 287-289.

Manolis, et al., "Incorporating Dimensions in XML and DTD", Database and Expert Systems Applications (LNCS 2113), © 2001, pp. 646-656.

Girardot, et al., "Millau: An encoding format for efficent representation and exchange of XML over the web", Computer Networks and ISDN Systems, North Holland Publishing, vol. 33, No. 1-6, Jun. 2000, pp. 747-765.

Liefke, et al., "Xmill: An Efficient Compressor for XML Data", MOD 2000, Dallas, TX, © 2000, pp. 153-164 (ACM 1-58113-218-2/00/05).

Sundaresan, et al., "Algorithms and programming models for efficient representation of XML for internet applications", Proceedings of the tenth international world wide web conference, May 1, 2001, pp. 366-375.

Levene, et al., "XML Structure Compression", Proceedings of the Second International Workshop on Web Documents, May 2002, pp. 1-14.

Hong, et al., "Automating the Transformation of XML Documents", WIDM 2001, Atlanta, GA, Nov. 2001, pp. 68-75.

Liefke, et al., "An Extensible Compressor for XML Data", SIGMOD Record, vol. 29, No. 1, Mar. 2000, pp. 57-62.

Thompson, et al., "XML schema part 1: Structures", W3C working draft, pp. 1-210, (1999), http://www/w3.orgITR/xmlschema-1.

Biron, et al., "XML schema part 2: Datatypes", W3 working draft, pp. 1-154 (1999), http://www.w3.orgITRIsmIschema-2.

"WAP Binary SML Content Format", W3C Note 24, (1999) pp. 1-22, http://www.w3.orqITRIwbxml/.

Deutsch, "GZIP file format specification version 4.3", RFC 1952, Aladdin Enterprises, pp. 1-12 (1996) http://www9.ord/w9cdrom/154/154.html.

Wallace, et al., "Haskell and XML: Generic Combinators ofType-Based Translation?", ICFP '99, Paris, France, Sep. 1999, pp. 148-159 (ACM 1-58113-111-9/99/0009).

Jesse, et al., "XML Documents From Scratch", Que Corp., Indianapolis, IN, Mar. 2000, pp. 135-140 and 237.

Huang, et al., "A Semantic Transcoding System to Adapt Web Services for Users With Disabilities", Assets '00, Arlington, VA, Nov. 13-15, 2000, pp. 156-163 (ACM 1-58113-314-8/00/0011).

Box, et al., "Essential XML: Beyond Markup", Addison-Wesley, Boston, MA, Sep. 2000, pp. 262-267.

"Microsoft Computer Dictionary—Fifth Edition" Microsoft Press, 2002, Microsoft Corporation. 4 Pages (375-376).

Cover, "The XML Cover Pages" XML & Compression. Feb. 19, 2001. 8 Pages.

Dunn, et al., "Transcoding on the Fly for the Web", pp. 1-11. Mar. 2000.

Jeuring, et al., "Generic Programming for XML Tools", pp. 1-12. May 27, 2002.

Holzner, "Inside XML", 2001 New Riders Publishing. 28 Pages.

* cited by examiner

FIG. 1

```
<xsd:schema targetNamespace="http://mysite/order"
    xmlns:my='http://mysite/order'
    xmlns:xsd='http://www.w3.org/2001/XMLSchema'>

<xsd:attribute name='NewCustomerDiscount' type="xsd:boolean"/>
    <xsd:element name="Order">
        <xsd:complexType>
            <xsd:sequence>
                <xsd:element ref="my:Customer"/>
                <xsd:element ref="my:ShoppingCart"/>
                <!-- ... -->
            </xsd:sequence>
        </xsd:complexType>
    </xsd:element>
    <xsd:element name="Customer">
        <xsd:complexType>
            <xsd:sequence>
                <xsd:element ref="my:CustomerId"/>
                <!-- ... -->
            </xsd:sequence>
            <xsd:attribute ref="my:NewCustomerDiscount"/>
        </xsd:complexType>
    </xsd:element>
    <xsd:element name="CustomerId" nillable="true" type="xsd:integer"/>
    <xsd:element name="ShoppingCart">
        <xsd:complexType>
            <!-- ... -->
        </xsd:complexType>
    </xsd:element>
</xsd:schema>
```

COMPRESSION OF STRUCTURED DOCUMENTS

BACKGROUND

Documents are commonly exchanged or transmitted between devices over the Internet or other networks. Some languages, due to their data-intensive nature, may require significant resources to store and communicate documents. For example, XML (eXtensible Markup Language) may be used to exchange documents, e.g., between a browser and a server. When the browser returns to edit a document, this information may be retrieved and reloaded, edited, and then may be saved again for future processing. Thus, the processing and communication of documents may in some cases consume a significant amount of computer or memory resources to store the documents and may require significant network resources to communicate this information. It may be desirable in some cases to reduce the amount of resources required to store and communicate these documents.

SUMMARY

Various embodiments are disclosed relating to compression of a document.

According to an example embodiment, a document may be compressed using a number of different techniques which may be used separately or in combination. For example, according to an example embodiment, a document may be compressed by replacing one or more language constructs in the document with a language-based replacement code. In addition, the document may be compressed by replacing one or more text strings in the document with a schema-based replacement code. In an example embodiment, a schema based replacement table may be generated based on a schema for use with the document according to a set of rules. This may allow both, for example, a transmitter and a receiver to independently generate the schema-based replacement table based on the schema.

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

DETAILED DESCRIPTION

Figure 1:
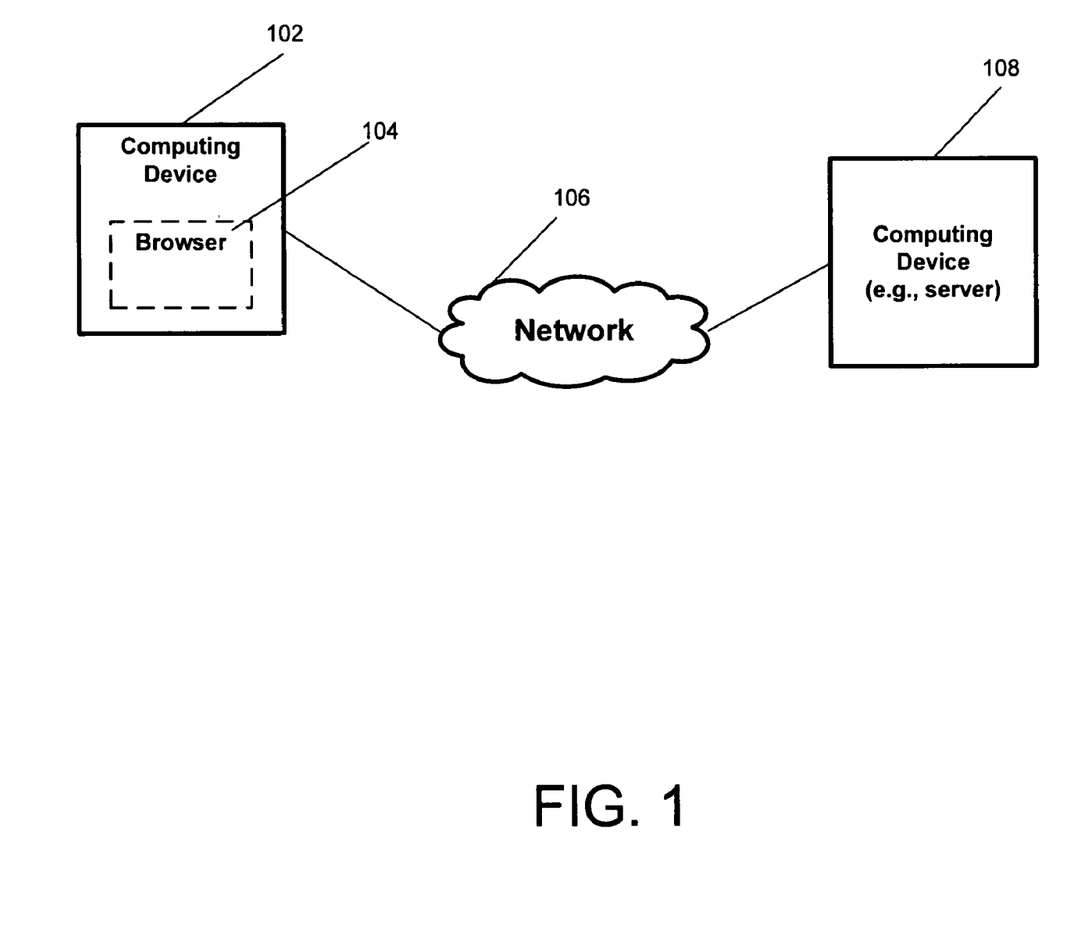
FIG. 1 is a block diagram of a system according to an example embodiment.

Referring to the Figures in which like numerals indicate like elements, FIG. 1 is a block diagram of a system according to an example embodiment. A computing device 102 may be coupled to a computing device 108 via a network 106. Computing devices 102 and 108 may be any type of computing device, such as a user device or a network device or other device. For example, network device 102 and 108 may each be a personal computer or PC, a handheld wireless device or cell phone, personal digital assistant or PDA, a server, a network resource such as a database, a switch or router, a proxy or agent, or other computing device. Each computing device may include, for example, a processor to execute software or instructions and provide overall control, memory, input/output device(s), a display, an operating system, and/or application software, although computing devices 102 and 108 may include a variety of additional common components or blocks.

According to an example embodiment, computing device 102 may be a user device (such as a PC or handheld device) and may include an application program, such as a browser 104. Computing device 108 may be, for example, a server. Computing devices 102 and 108 may communicate with each other via network 106, and may exchange information using one or more protocols, for example. The information exchanged by computing devices 102 and 108 may be provided in any format. In an example embodiment, information exchanged between computing devices 102 and 108 may include structured documents, such as XML (Extensible Markup Language) documents, although other structured documents may be used. XML is merely provided as an example, and the various embodiments are not limited thereto.

According to an example embodiment, a document may be based upon a language, such as XML or other language. According to an embodiment, the document may be compressed based on the structure of that language, such as, for example, replacing one or more language constructs in the document with a language-based replacement code. This may allow one or more language constructs in the document to be replaced based on either a required structure (e.g., well formed nature or required syntax of an XML document, for example) or a common usage pattern for the language.

For example, in XML, each start tag must typically have an end tag that uses the same name. Also, XML typically requires start tags and end tags to nest with other sets of start and end tags. Thus, according to an example embodiment, once the start tag is known, the corresponding end tag may be replaced with a language-based replacement code indicating "end tag" or "end element." The required nesting arrangement according to XML language may therefore identify which end tag should be there, based on earlier start tags in the document. The replacement of an end tag (or end element) is an example of replacing a language construct based on a required structure or required syntax of a language, for example.

Another example of a required language construct may be a start element with a same prefix as the last element. For example a start element (or start tag) may be <prefix:element name>. An example may be <my:CustomerName>, where my is the prefix and CustomerName is the element name. If the prefix "my" was used as the prefix in the last element (e.g., for last start element), then the replacement code for "Element-with-same-Prefix-as-last-Element" may be used to replace the element <my: >. Also, the element name (e.g., CustomerName) may, for example, remain as text, or may itself be replaced with a replacement code described in more detail below (e.g., schema-based replacement code).

According to another example embodiment, language constructs may also be replaced based on a common usage for the language. For example, namespace declarations, although not required by XML, are commonly used. For example, a namespace declaration may be xmlns:namespace-prefix="namespace-name." The namespace declaration (xmlns: ="") may be replaced with a language-based replacement code. An example of a namespace declaration may be xmlns:my=http://mysite/order. The specific attributes within the namespace declaration, including the namespace prefix (e.g., my) and namespace name (e.g., http://mysite/order) may remain as text, but may themselves be replaced with separate replacement codes described in greater detail below.

TABLE 1

Example Language-Based Replacement Table
Example Language-Based Replacement Table

| Example XML Language Constructs | Language-Based Replacement Code |
|---|---|
| Element-With-Prefix (e.g., start element or start tag) | 0 |
| Element-With-Same-Prefix-As-Last-Element (e.g., start element or start tag) | 1 |
| End-Element (or end tag) | 2 |
| Namespace-Declaration | 3 |
| Attribute-With-Same-Prefix-As-Last-Element | 4 |

Table 1 above is an example language-based replacement table that lists several example language constructs in the left-hand column and the associated (language-based) replacement codes in the right-hand column. For example, Element-With-Prefix is assigned the replacement code of "0", an Element-With-Same-Prefix-As-Last-Element is assigned the replacement code of "1", an End-Element (or end tag) is assigned the replacement code of "2", a namespace declaration is assigned the replacement code of "3", etc. Only a few language constructs are shown in Table 1, and many other language constructs may be used for a language-based replacement table to compress a document. Of course, if other languages are used (e.g., other than XML), then the language constructs may be different based on the particular syntax, format or rules, common patterns of usage, etc., for that language. XML is an example language and other languages may be used.

According to an example embodiment, one or more language constructs (such as end tags, etc.) may be replaced in a document with language-based replacement codes, as described above. After such compression or replacement, there may remain a number of additional text strings in the document, such as element names, start tags, etc. Therefore, an additional replacement technique may be used to further compress the document using additional replacement codes that may be generated based on a schema for use with the document, according to an example embodiment.

Figure 2:
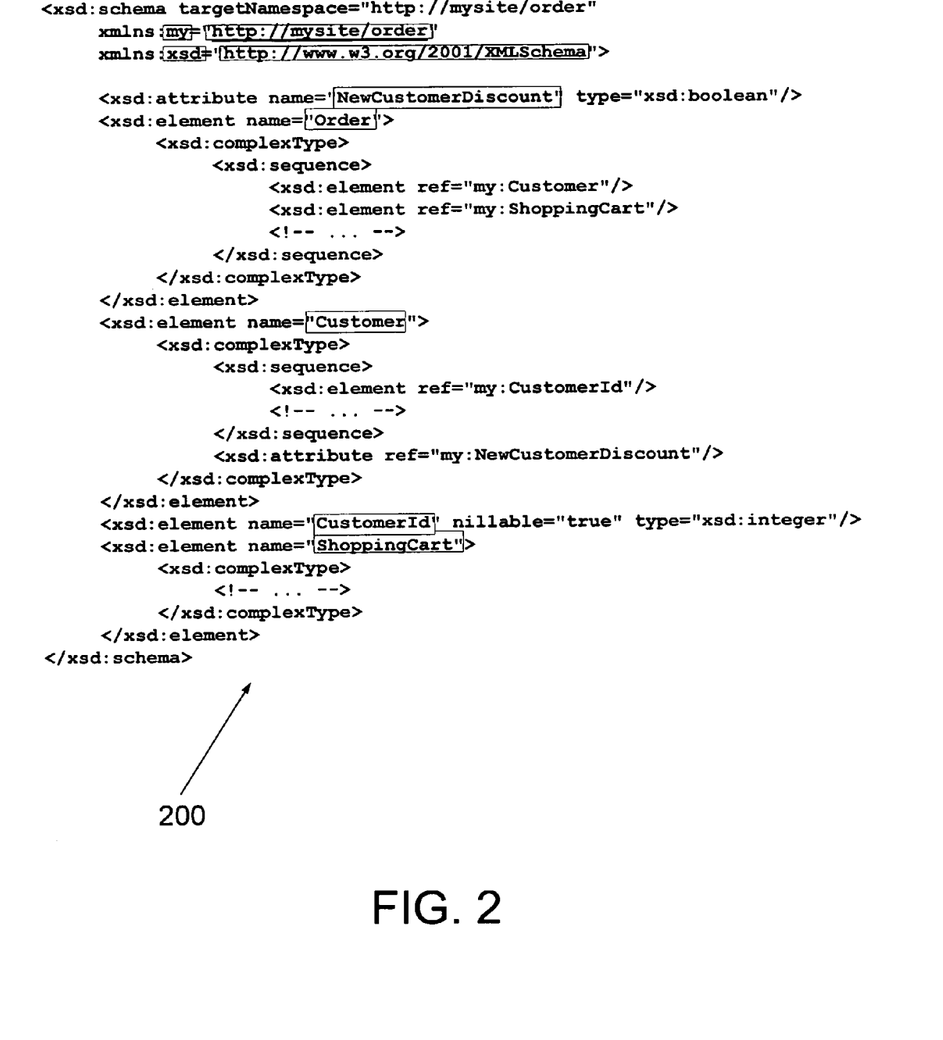
FIG. 2 is a diagram illustrating a schema according to an example embodiment.

FIG. 2 is a diagram illustrating a schema according to an example embodiment. A schema may specify a required structure for a document, such as indicating the ordering of tags in the document, the fields that are mandatory, the data types of fields, etc. The schema 200 illustrated in FIG. 2 is an XML schema, but any schema may be used. For example, in XML, a document may be well-formed if it satisfies the basic rules of syntax required by XML. Also in XML, a valid document may be, for example, a document that is well-formed and that satisfies a schema.

According to an example embodiment, a structured document (such as an XML document) may be compressed based on a value replacement table. In an example embodiment, a value replacement table may indicate codes (e.g., hex values, alpha-numeric values, or other codes) that may be used to replace text strings or other values in a structured document in order to decrease the size of the document. In one example embodiment, a value replacement table may be generated based on a schema for use with the document (the document to be compressed). The value replacement table may be generated based on the schema to be used for the document according to a set of rules, for example. This may allow both a transmitting device and a receiving device to independently generate the value replacement table based on the schema. In this manner, further compression or transmission efficiency may be obtained by not transmitting the value replacement table, since its transmission is unnecessary. This is because the receiving node may generate the value replacement table, for example, based on the schema for the document according to a same set of rules used by both transmitting device and receiving device.

A variety of different sets of rules may be used to generate the (schema-based) value replacement table. For example, a plurality of text strings or values in the schema may be put in alphabetical order, and a number (replacement code) assigned to each text string or value in increasing order (e.g., 0, 1, 2, 3. . . ). This is merely one example set of rules for generating a value replacement table, and many other rules may be used. According to an example embodiment, text strings or values that may typically be present in both the schema and the (e.g., XML) document may be considered good candidates for replacement codes (and thus, compression), since the replacement codes may be identified based only on the schema (e.g., not the document) and then used to compress (and later decompress) the document. For example, for an XML schema, value replacement codes may be identified for each of the following text strings or values present in the XML schema (merely as examples): element names, attribute names, enumeration values, default values, fixed values, values of namespace declarations, etc. and other text strings or values.

In schema 200 of FIG. 2, boxes are placed around values or text strings for which example replacement codes have been identified, in this example. Table 2 below is an example value replacement table based on schema 200 (FIG. 2). The left-hand column identifies nine different values or text strings found in the schema 200, while right-hand column identifies the replacement code or schema-based replacement code (e.g., numeric codes 0-8) assigned to each value or text string. For example, the element name "Customer" is assigned the schema-based replacement code "0". The element name "CustomerId" is assigned the schema-based replacement code of "1". The value of the namespace "http://mysite/order" is assigned the schema-based replacement code of "2". The text string of "http://www.w3.org/2001/XMLSchema" is assigned the schema-based replacement code of "3". The text string "my" is assigned the schema-based replacement code "4". The attribute name "NewCustomerDiscount" is assigned the schema-based replacement code of "5", and so on. The schema-based replacement codes may typically be shorter in length than one or more of the values or text strings they are replacing. Thus, by replacing the value or text string with the replacement code, the document may be compressed or become shorter than the original or uncompressed document (e.g., fewer characters).

Note that the text strings or values are provided in Table 2 in alphabetical order. Also, the schema-based replacement codes may, for example, be assigned in numerical order (e.g., 0, 1, 2, 3, . . . 8), per the example rules for generating the example value replacement table (shown in Table 2). Thus, in an example embodiment, a transmitting device and a receiving device(s) may have agreed in advance to use a same set of rules to generate the value replacement table based on a schema. These are merely example rules, and other types of rules may be used.

TABLE 2

Example Value Replacement Table Based on Schema
(Schema-Based Value Replacement Table)

| Value or Text String from Schema 200 (FIG. 2) | Example Schema-Based Replacement Code |
|---|---|
| Customer | 0 |
| CustomerId | 1 |
| http://mysite/order | 2 |
| http://www.w3.org/2001/XMLSchema | 3 |
| my | 4 |
| NewCustomerDiscount | 5 |
| Order | 6 |
| ShoppingCart | 7 |
| xsd | 8 |

Table 3 below lists an example uncompressed XML document. Table 4 below lists an example output after being compressed (e.g., compressed XML document) based on using both: 1) a language-based replacement table (e.g., language based replacement codes to replace language constructs), and 2) a value replacement table (or schema-based replacement table) based on a schema (e.g., schema-based replacement codes). Some examples will be described to illustrate aspects of this compression process, with reference to Table 3 and Table 4.

The first element of the uncompressed document is a start element with a prefix <my:Order xmlns:my="http://mysite/order">. Thus, this language construct is replaced with a zero (0), indicating element-with-prefix (replacement code of 0 from the language-based replacement table, see Table 1). Next, the prefix "my" (within that first element) is a text string that has been assigned the schema-based replacement code of 4 (see Table 2). Next, the text string "Order" is replaced with the schema-based replacement code of 6 (see Table 2). Next the namespace declaration (xmlns:. ". . ." ) is replaced with the langauge-based replacement code of 3 (indicating namespace declaration, see Table 1). The prefix "my" (within the namespace declaration) is replaced with the schema-based code of 4 (see Table 2). Next, the text string http://mysite/order is replaced with the schema-based replacement code of 2 (see Table 2). Thus, this may result in a compressed document output of: 046342. . . . Other values or strings or language constructs may be similarly replaced with their appropriate replacement codes. This process may be reversed at a receiver, for example, in order to decompress the compressed structured document (e.g., replace the replacement codes in the compressed document with the associated language construct or text string or value).

TABLE 3

Example Uncompressed XML Document
Example Uncompressed XML Document

<my:Order xmlns:my="http://mysite/order"> <my:Customer my:NewCustomerDiscount="false"><my:CustomerId>1245553 </my:CustomerId></my:Customer><my:ShoppingCart>...</my:ShoppingCart></my:Order>

TABLE 4

Example Compressed XML Document
Example Compressed XML

0463421045false1112455532211...22

Note that while the use of the language-based replacement table is shown in this example as being performed before the use of the schema-based replacement table, these two techniques may be performed in any order, and may also be used alone or separately to compress a document.

Figure 3:
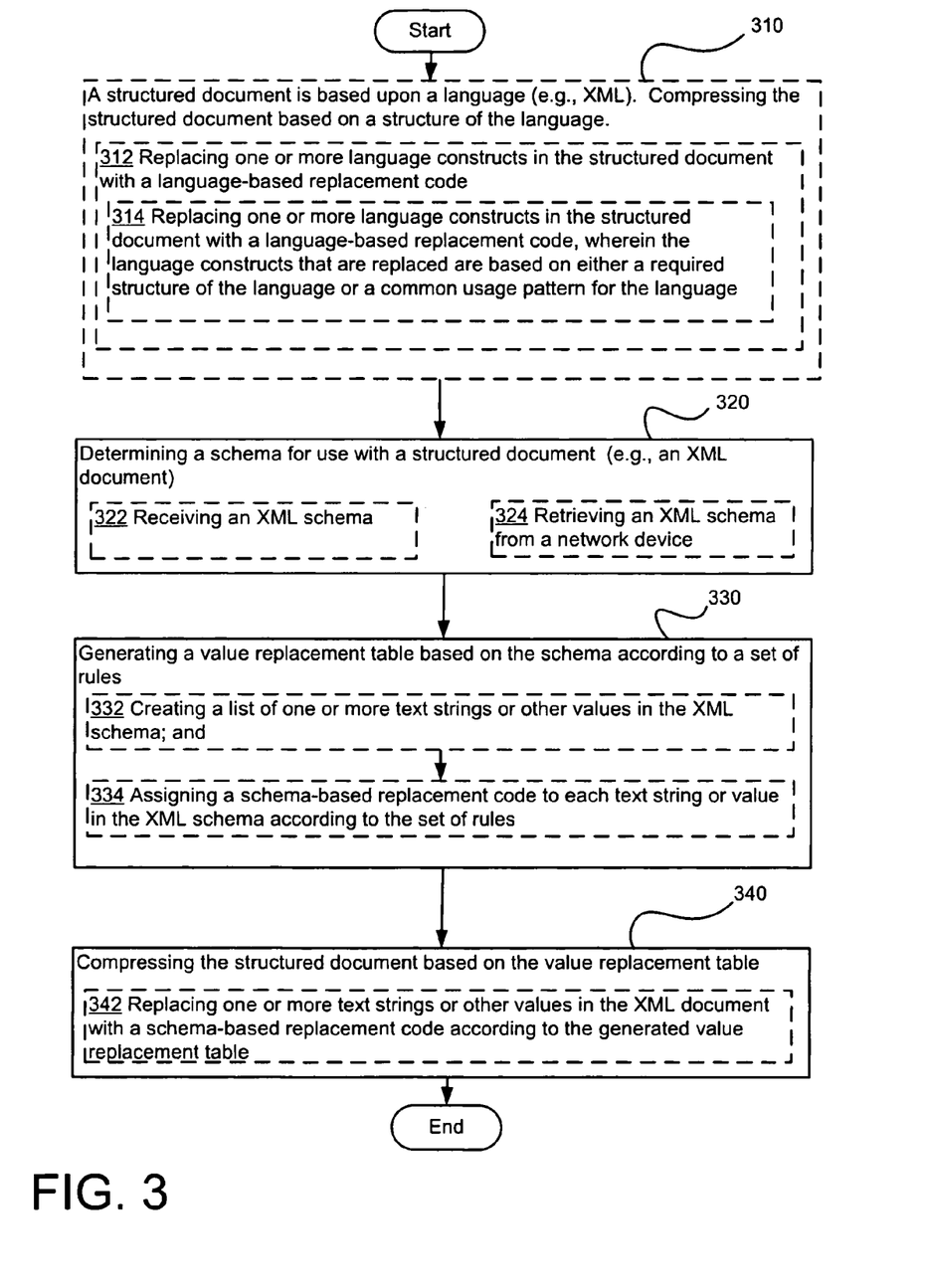
FIG. 3 is a flow chart illustrating compression of a structured document according to an example embodiment.

FIG. 3 is a flow chart illustrating compression of a structured document according to an example embodiment. At 310, a structured document may be based upon a language, such as XML or other language. The structured document may be compressed based on a structure of the language. For example, at 312, one or more language constructs in the document may be replaced with a language-based replacement code. In another example embodiment, at 314, one or more language constructs in the document may be replaced with a language-based replacement code. For example, the replacement of the language construct(s) with codes may be based upon either a required structure or format or syntax of the language or a common usage pattern for the language.

At 320, a schema is determined for use with the structured document. For example, at 322, an XML schema or other schema may be received. At 324, a schema may be retrieved from a network device, network resource, server, etc., for example based on a Uniform Resource Identifier (URI) or other identifier.

At 330, a value replacement table (e.g., a schema-based replacement table) is generated based on the schema according to a set of rules. For example, this may include, at 322, creating a list of one or more text strings or other values in the schema, and at 324, assigning a schema-based replacement code to each text string or value in the list according to the set of rules.

At 340, the structured document may be compressed based on the value replacement table (e.g., schema based replacement table). For example, this may include replacing one or more text strings or values in the structured document with a schema-based replacement code according to the generated value replacement table.

Figure 4:
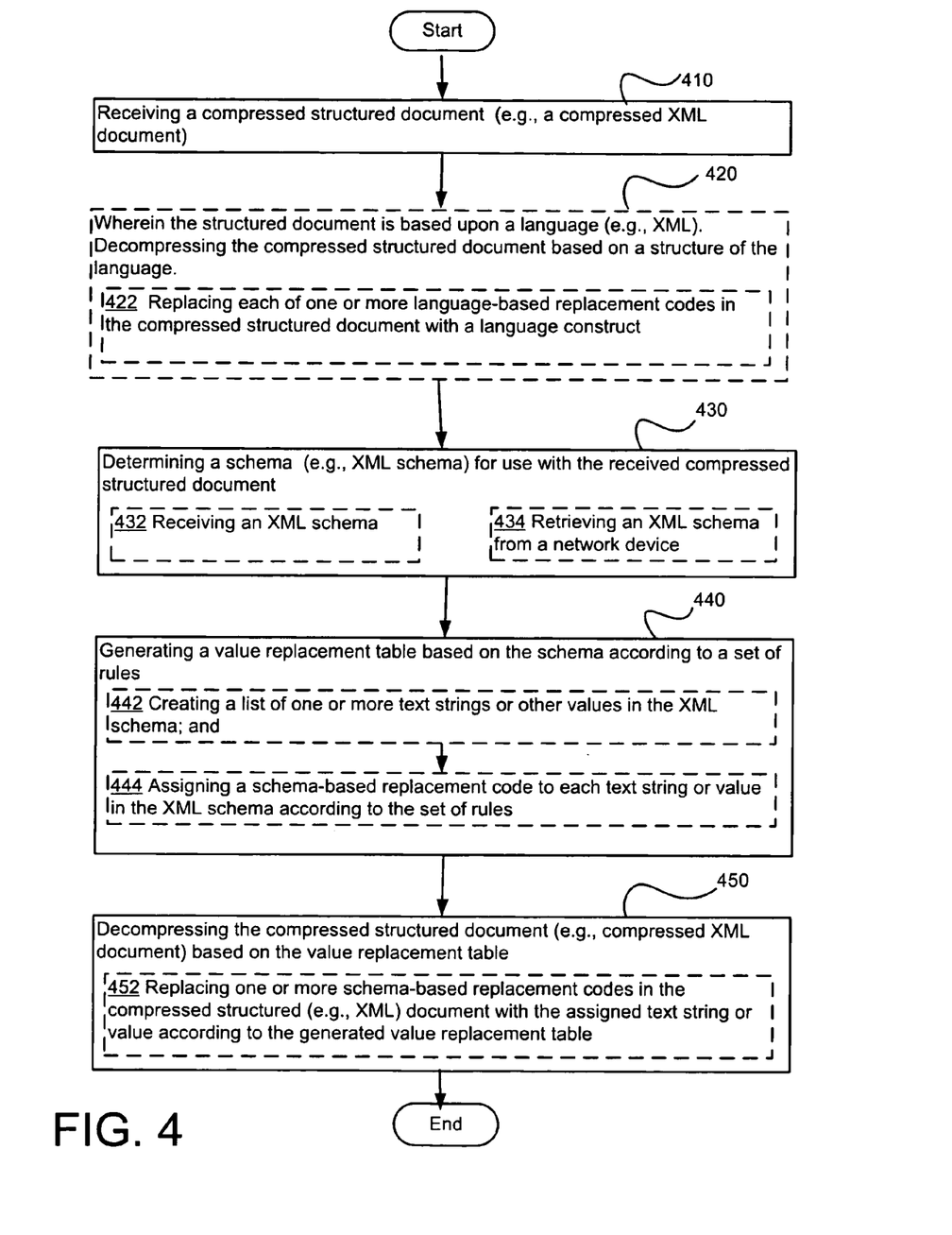
FIG. 4 is a flow chart illustrating decompression of a compressed document according to an example embodiment.

FIG. 4 is a flow chart illustrating decompression of a compressed document according to an example embodiment. At 410, a compressed structured document (such as a compressed XML document) is received.

At 420, according to an example embodiment, the structured document may be based on a language, such as XML. The structured compressed document may be decompressed (or partially decompressed) based on a structure of the language. This may include, for example, replacing each of one or more language-based replacement codes in the compressed structured document with a language construct.

At 430, a schema is determined for use with the received compressed document. For example, at 432, an XML schema may be received, or at 434, an XML schema may be retrieved.

At 440, a value replacement table (e.g., a schema-based replacement table) is generated based on the determined schema according to a set of rules. This may include, for example, at 442, creating a list of one or more text strings or values in the schema, and at 444, assigning a schema-based replacement code to each text string or value in the list according to a set of rules.

At 450, the compressed structured document may be decompressed based on the value replacement table (e.g., schema-based replacement table). For example, this may include replacing one or more schema-based replacement codes in the compressed document with the assigned text string or value according to the generated value replacement table.

By compressing a document, this may offer a number of advantages, such as one or more of reducing the amount of data stored on servers, databases and other computing devices, reducing the amount of data transmitted between devices, reducing the network latency for such data transmission, freeing up resources and reducing the load on servers, etc. These are merely some examples, and the various embodiments are not limited thereto.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. A method to be performed on a computing device, the computing device comprising a processor and a memory, the method comprising:

determining a schema for use with a structured document, wherein the structured document is based upon a language, wherein the structured document comprises an XML document;

generating a value replacement table based on the schema according to a set of rules;

compressing the structured document based on the value replacement table and based on a structure of the language, wherein the compressing the structured document based on the structure of the language comprises replacing one or more language constructs in the structured document with a language-based replacement code, including performing at least one of the following:

replacing a language construct of an element-with-a-prefix with a replacement code;

replacing a language construct of element-with-same-prefix-as-last-element with a replacement code;

replacing a language construct of an end-element or end-tag with a replacement code;

replacing a language construct of a name-space-declaration with a replacement code; and replacing a language construct of an attribute-with-same-prefix-as-last-element with a replacement code, wherein the language constructs that are replaced are based on either a required structure of the language or a common usage pattern for the language; and transmitting the compressed structured document without transmitting the value replacement table, the compressed structured document comprises a compressed XML document.

2. The method of claim 1 wherein the schema comprises an XML schema, and wherein the generating a value replacement table comprises:

creating a list of one or more text strings or other values from the XML schema; and assigning a schema-based replacement code to each text string or value according to the set of rules.

3. The method of claim 2 wherein the assigning a schema-based replacement code comprises assigning a replacement code for one or more of each of the following present in the XML schema:
- element names;
- attribute names;
- enumeration, default and/or fixed values; and
- values of namespace declarations.

4. The method of claim 1 wherein the structured document comprises an XML document, the compressing comprises replacing one or more text strings or other values in the XML document with a schema-based replacement code according to the generated value replacement table.

5. The method of claim 1, wherein the structured document comprises an XML document, and further comprising compressing the XML document by removing some recoverable information in the XML document based on a well-formed nature or required structure of the XML document.

6. The method of claim 1 and further comprising:
- receiving the compressed document at a receiving computing device; and
- performing the following at the receiving computing device:
  - determining the schema to be used for the received document;
  - generating the value replacement table based on the schema according to the set of rules; and
  - decompressing the compressed document based on the value replacement table.

7. An apparatus comprising:
a processing device adapted to:
- determine a schema for use with a structured document, wherein the structured document is based upon a language, wherein the structured document comprises an XML document;
- generate a value replacement table based on the schema according to a set of rules;
- compress the structured document based on the value replacement table and based on a structure of the language, wherein the compressing the structured document based on the structure of the language comprises replacing one or more language constructs in the structured document with a language-based replacement code, including performing at least one of the following:
  - replacing a language construct of an element-with-a-prefix with a replacement code;
  - replacing a language construct of element-with-same-prefix-as-last-element with a replacement code;
  - replacing a language construct of an end-element or end-tag with a replacement code;
  - replacing a language construct of a name-space-declaration with a replacement code; and
  - replacing a language construct of an attribute-with-same-prefix-as-last-element with a replacement code; and
- transmit the compressed structured document without transmitting the value replacement table, the compressed structured document comprises a compressed XML document.

8. The apparatus of claim 7 wherein the schema comprises an XML schema, the processing device adapted to generate comprises a processing device adapted to:
- create a list of one or more text strings or other values in the XML schema; and
- assign a schema-based replacement code to each text string or value in the XML schema according to the set of rules.

9. The apparatus of claim 7 wherein the processing device adapted to compress comprises a processing device adapted to replace one or more text strings or other values in the document with a schema-based replacement code according to the generated value replacement table.

10. The apparatus of claim 7 wherein the language constructs that are replaced are based on either a required structure of the language or a common usage pattern for the language.

11. A method to be performed on a computing device, the computing device comprising a processor and a memory, the method comprising:
- receiving a compressed structured document without receiving a value replacement table, wherein the structured document is based upon a language, wherein the structured document comprises an XML document;
- determining a schema for use with the received compressed structured document;
- generating a value replacement table based on the schema according to a set of rules, wherein the generating comprises:
  - creating a list of one or more text strings or other values in the schema; and
  - assigning a schema-based replacement code to each text string or value in the schema according to the set of rules; and
- decompressing the compressed structured document based on a structure of the language and based on the value replacement table, wherein the decompressing comprises: replacing each of one or more language-based replacement codes in the compressed structured document with a language construct, wherein the compressed structured document comprises a compressed XML document.

12. The method of claim 11 wherein the language construct comprises an XML tag.

* * * * *